US010734942B2

(12) United States Patent
Lopez et al.

(10) Patent No.: US 10,734,942 B2
(45) Date of Patent: Aug. 4, 2020

(54) ASYMMETRICAL INTEGRATED FRAME FOR PHOTOVOLTAIC MODULE

(71) Applicant: DOW GLOBAL TECHNOLOGIES LLC, Midland, WI (US)

(72) Inventors: Leonardo C. Lopez, Midland, WI (US); Gerald K. Eurich, Merrill, MI (US); Kurt A. Koppi, Midland, MI (US); Joseph A. Langmaid, Caro, MI (US)

(73) Assignee: Dow Global Technologies LLC, Midland, MI (US)

( * ) Notice: Subject to any disclaimer, the term of this patent is extended or adjusted under 35 U.S.C. 154(b) by 85 days.

(21) Appl. No.: 15/739,671

(22) PCT Filed: Jun. 20, 2016

(86) PCT No.: PCT/US2016/038344
§ 371 (c)(1),
(2) Date: Dec. 22, 2017

(87) PCT Pub. No.: WO2016/209763
PCT Pub. Date: Dec. 29, 2016

(65) Prior Publication Data
US 2018/0198404 A1 Jul. 12, 2018

Related U.S. Application Data

(60) Provisional application No. 62/185,077, filed on Jun. 26, 2015.

(51) Int. Cl.
*H01L 31/044* (2014.01)
*H02S 40/36* (2014.01)
(Continued)

(52) U.S. Cl.
CPC .............. *H02S 40/36* (2014.12); *H02S 20/25* (2014.12); *H01L 31/0203* (2013.01); *Y02B 10/12* (2013.01)

(58) Field of Classification Search
CPC .................. H01L 31/00–078; Y02E 10/50–60
(Continued)

(56) References Cited

U.S. PATENT DOCUMENTS

| 5,437,735 A | 8/1995 | Younan et al. |
| 7,387,537 B1 * | 6/2008 | Daily ................. H01R 13/6272 439/281 |

(Continued)

FOREIGN PATENT DOCUMENTS

| CN | 102017184 A | 4/2011 |
| CN | 202332933 U | 7/2012 |

(Continued)

OTHER PUBLICATIONS

International Search Report and Written opinion dated Dec. 29, 2016 for PCT application No. PCT/US2016/038344, 11 pages.

*Primary Examiner* — Bach T Dinh

(57) ABSTRACT

A photovoltaic module comprising: (a) a photovoltaic laminate including: (i) one or more connectors connected to and extending from the photovoltaic laminate, and (ii) one or more integrated frames each including one or more engagement features, and the one or more integrated frames being in communication with each of the one or more connectors; and wherein the one or more engagement features are asymmetrical so that each of the one or more connectors can only be installed in each of the one or more integrated frames in a single configuration; and wherein each of the one or more integrated frames are connected to the photovoltaic laminate in a location proximate to the one or more connectors so that the one or more integrated frames provide (Continued)

support to the one or more connectors during the manufacturing process, during use, during installation, or a combination thereof.

9 Claims, 8 Drawing Sheets

(51) Int. Cl.
*H02S 20/25* (2014.01)
*H01L 31/0203* (2014.01)

(58) Field of Classification Search
USPC .................................................. 136/243–265
See application file for complete search history.

(56) References Cited

U.S. PATENT DOCUMENTS

| | | |
|---|---|---|
| 8,631,614 B2 | 1/2014 | Livsey et al. |
| 2008/0271773 A1 | 11/2008 | Jacobs et al. |
| 2008/0283111 A1 | 11/2008 | Higashikozono et al. |
| 2009/0215304 A1* | 8/2009 | Faust ............... H01L 31/02008 439/358 |
| 2010/0180523 A1 | 7/2010 | Lena et al. |
| 2010/0311262 A1* | 12/2010 | Cours ............... H01R 13/6641 439/281 |
| 2011/0048507 A1 | 3/2011 | Livsey et al. |
| 2011/0183540 A1 | 7/2011 | Keenihan et al. |
| 2011/0220183 A1 | 9/2011 | Mills et al. |
| 2012/0118349 A1 | 5/2012 | Keenihan et al. |
| 2012/0264319 A1 | 10/2012 | Chikano |
| 2014/0000709 A1 | 1/2014 | Langmaid et al. |

FOREIGN PATENT DOCUMENTS

| | | |
|---|---|---|
| CN | 202549891 U | 11/2012 |
| CN | 202839678 U | 3/2013 |
| CN | 103477445 A | 12/2013 |
| EP | 0471943 A1 | 2/1992 |
| JP | 2003161003 A | 6/2003 |
| WO | 2009137347 A2 | 11/2009 |
| WO | 2011019886 A1 | 2/2011 |
| WO | 2012082613 A2 | 6/2012 |

* cited by examiner

ASYMMETRICAL INTEGRATED FRAME FOR PHOTOVOLTAIC MODULE

CROSS-REFERENCE TO RELATED APPLICATIONS

The present application is a U.S. National Stage entry under 35 U.S.C. § 371 of International Application No. PCT/US2016/038344, filed on Jun. 20, 2016, designating the United States of America and published in English on Dec. 29, 2016, which in turn claims priority to U.S. Provisional Application No. 62/185,077, filed on Jun. 26, 2015, each of which is hereby incorporated by reference in its entirety.

FIELD

The present teachings generally relate to a frame for providing support to a connector of a photovoltaic laminate and more specifically for controlling geometry of a connector and protecting the connector, the integrated frame being asymmetrical so that the frame and connector are installed in a single configuration.

BACKGROUND

Photovoltaic modules include an active portion that captures sunlight and converts sunlight into electricity. The active portion may be part of a composite of materials. A connector extends from the active portion so that an electrical connection, a mechanical connection, or both may be made. The connector during the manufacturing process may be misaligned, moved, bent, damaged, or a combination thereof by contact with one or more components of the manufacturing process such that the active portion cannot be used. The connector may form a cantilever connection with the active portion so that during removal of the active portion from the machinery and/or transportation the connectors may be damaged. Moreover, the connector may have a predetermined attachment location so that polarity of the connections are properly aligned and each of the connectors need to be attached in a specific location, in a specific configuration, or both.

Typically, photovoltaic arrays are placed in an elevated location such as a roof top of a home or a building or in a rack and frame that elevates the photovoltaic array so that the photovoltaic array is exposed to sunlight. Each of these photovoltaic modules in order to get them to a roof top or elevated location are moved to the roof top or elevated location and then moved along the roof top or elevated location and into position, typically by one or more people carrying the modules, which may result in one or more of the connectors becoming damaged, bent, or unable to perform their connection function. Each photovoltaic module is then secured to the elevated location directly to a roofing structure and/or indirectly by a connection structure such as a rack and frame so that a photovoltaic array is formed. Each photovoltaic module of the photovoltaic array includes an active portion and the active portions of two or more photovoltaic modules may be placed in close proximity with one another so that a photovoltaic array is formed by connecting each of the photovoltaic modules together.

In cases where the photovoltaic modules provide roofing functions (i.e., building integrated photovoltaic (BIPV)), the photovoltaic modules may include both an active portion and a support portion and the active portion of one photovoltaic module may fully and/or partially cover the support portion of an adjacent photovoltaic module to replace the framing and racking structure. In cases of building integrated photovoltaics, the support portion may provide roofing functions or structural functions for subsequent photovoltaic modules. The support structures of a roof may not have consistent flatness or strength due to variations in fabrication and/or age of the roof, and the shape of the roof may vary over time due to movement and/or aging of the foundation and/or roofing structure. At some point over the life of the photovoltaic array, the home owner, a repair person, an installer, or a combination thereof may be required to walk across the photovoltaic array. As the individual walks across the photovoltaic array, each individual photovoltaic module may bend and flex due to the variations in strength and/or flatness of the support structures, which may result in the photovoltaic module, a connector, or both bending enough so that the photovoltaic module, connector, or both are damaged. This weight and variation in strength may bend, crack, misalign, or a combination thereof connectors that connect the photovoltaic modules so that the connectors are not able to perform the mechanical and/or electrical connections to be formed. It would be attractive to have a photovoltaic module which has a connector that is resistant to damage from manufacturing movement, installation movement, or installed movement. It would be attractive to have a photovoltaic module where the cantilever connection of the connector is supported so that the geometry of the connector is maintained. It would further be attractive to have an integrated frame that supports the connector and has an asymmetrical configuration so that the header connector is connected correctly to the photovoltaic module.

Examples of some photovoltaic modules may be found in U.S. Pat. Nos. 5,437,735; 8,631,614; U.S. Patent Application Publication No. 2008/0271773; 2010/0180523; and International Patent Application No. WO2011/019886; and Chinese Patent Nos. CN202839678U and CN202332933U all of which are incorporated by reference herein in their entirety for all purposes. It would be attractive to have a device that assists in attaching a connector to the photovoltaic module. It would be attractive to have a device that mirrors the shape of all or a portion of a connector and especially a clip of a connector. What is needed is a feature of an integrated frame such as a pocket that accommodates a clip of a connector so that the clip is accommodated and the connector is flush within the integrated frame. What is needed is a device that prevents the connector and a clip of the connector from being separated, the clip from being dislodged from the connector, or both. What is needed is a disengagement opening that allows access to the clip within the connector so that the clip and connector can be separated.

SUMMARY

The present teachings provide a device for supporting one or both of the connectors for a photovoltaic laminate. The device may connect to the photovoltaic laminate proximate to the connector and provide support to the connector so that the connector substantially maintains its positioning over its lifetime. The device may provide lateral support, longitudinal support, rotational support, or support in any direction therebetween. The device may assist in aligning the connector so that during formation the connector can only be installed in a single configuration. The device may include one or more pockets or retention slots for retaining a header clip with the connector. The device may include a flared extension or disengagement openings so that a header clip may be accommodated, manipulated, or both.

The present teachings meet one or more of the present needs by providing: a photovoltaic module comprising: (a) a photovoltaic laminate including: (i) one or more connectors connected to and extending from the photovoltaic laminate, and (ii) one or more integrated frames each including one or more engagement features, and the one or more integrated frames being in communication with each of the one or more connectors; and wherein the one or more engagement features are asymmetrical so that each of the one or more connectors can only be installed in each of the one or more integrated frames in a single configuration; and wherein each of the one or more integrated frames are connected to the photovoltaic laminate in a location proximate to the one or more connectors so that the one or more integrated frames provide support to the one or more connectors during the manufacturing process, during use, during installation, or a combination thereof.

The teachings herein surprisingly solve one or more of these problems by providing a connector to the photovoltaic module. The present teachings provide a device that mirrors the shape of all or a portion of a connector and especially a clip of a connector. The present teachings provide a feature of an integrated frame such as a pocket that accommodates a header clip of a connector so that the clip is accommodated and the connector is flush within the integrated frame. The present teachings provide a device that prevents the connector and a header clip of the connector from being separated, the header clip from being dislodged from the connector, or both. The present teachings provide a disengagement opening that allows access to the header clip within the connector so that the header clip and connector can be separated.

DETAILED DESCRIPTION

Figure 1:
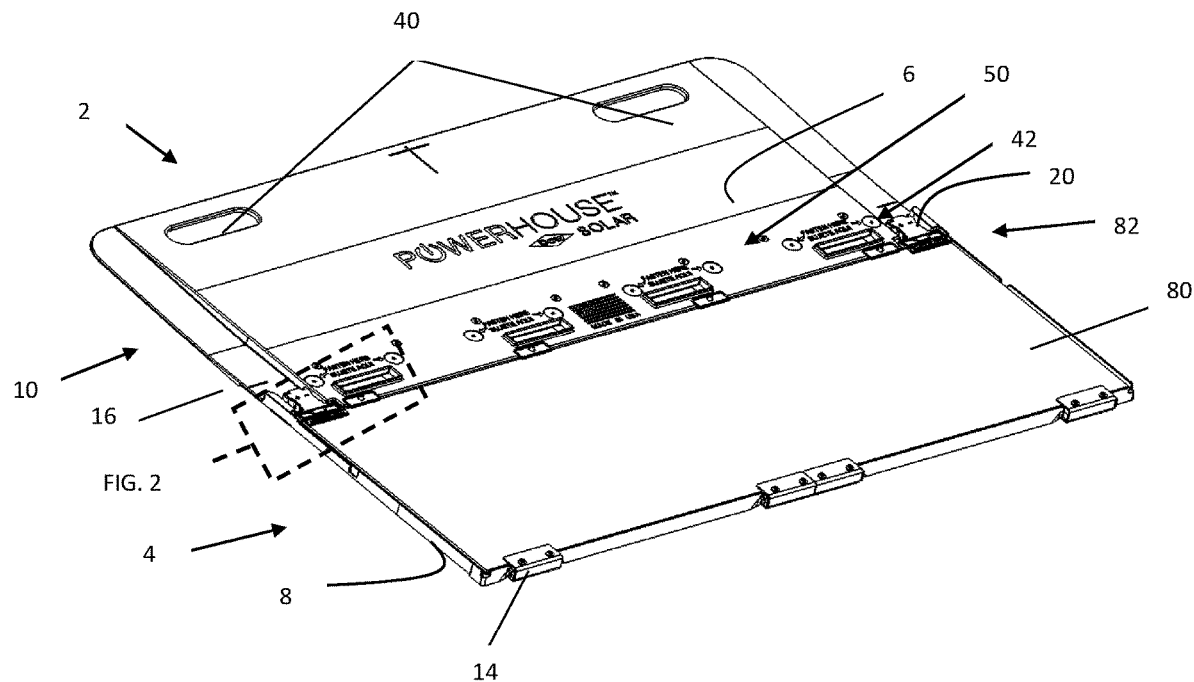
FIG. 1 illustrates a perspective view of a photovoltaic module.

The explanations and illustrations presented herein are intended to acquaint others skilled in the art with the teachings, its principles, and its practical application. Those skilled in the art may adapt and apply the teachings in its numerous forms, as may be best suited to the requirements of a particular use. Accordingly, the specific embodiments of the present teachings as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

A plurality of photovoltaic modules of the teachings herein are combined together to form a photovoltaic array. The photovoltaic array collects sunlight and converts the sunlight to electricity. Generally, each of the photovoltaic modules may be individually placed in a structure that houses all of the photovoltaic modules forming all or a portion of a photovoltaic array. The photovoltaic modules of the teachings herein may be used with a housing that contains all of the individual photovoltaic modules and make up a photovoltaic array. Preferably, the photovoltaic array taught herein is free of a separate structure that houses all of the photovoltaic modules that make up a photovoltaic array (also referred to as a solar array). More preferably, each individual photovoltaic module may be connected directly to a structure (i.e., is a building integrated photovoltaic (BIPV)) and each of the individual photovoltaic modules are electrically connected together so that a photovoltaic array is formed. Most preferably, each individual photovoltaic module may include a base plate, interconnection wiring, and a photovoltaic laminate. Each base plate may include a support portion, an active portion, and an overlap portion. The active portion (i.e., support portion and photovoltaic laminate) may overlap all or a portion of one or more adjacent photovoltaic modules (e.g., the overlap portion) forming a "double overlap" so that each photovoltaic module may be protected and connected to a connection surface and/or so that the combined photovoltaic modules may form a shingle structure for diverting fluids from the roof of the structure. Each of the photovoltaic modules may have a portion that may be indirectly and/or directly connected to a connection surface. The base plate may directly connect to a connection surface and the photovoltaic laminate may be connected to a support portion of the base plate (i.e., the photovoltaic laminate may be indirectly connected to the connection surface). Preferably, the overlap portion of each of the photovoltaic modules may be directly connected to a connection surface, and the active portion may be connected directly to the overlap portion or directly to the connection surface by a fastener that extends through the overlap portion, around the overlap portion, through a fastener support in the overlap portion, or a combination thereof. More preferably, each of the photovoltaic modules may include a base plate and a photovoltaic laminate and the base plate is connected to a connection surface by one or more fasteners that extend through fastener supports and preferably a plurality of fasteners that extend through fastener supports at the fastener locations.

The fastener supports may be located within the active portion, the overlap portion, the support portion, or a combination thereof. Preferably, the fastener supports may be located within the overlap portion at fastener locations. The fastener supports may be a through hole that extends through the overlap portion, a weakened area so that a fastener may be placed through the fastener support, a removable portion, a punch out, an area of lower hardness, or a combination thereof. Preferably, the fastener supports may be a region where the base plate is reinforced so that fasteners may extend through and connect the photovoltaic module, the base plate, or both to the one or more connection surfaces and the fasteners do not damage the photovoltaic laminate when the base plate, the overlap portion, or both is subjected to movement. A plurality of fastener supports may extend across the width of the base plate (e.g., a fastener location region). The fastener supports may be located in the base plate so that the photovoltaic laminate, the connectors, or both are prevented from moving, being damaged, bending, or a combination thereof. The one or more fastener supports and preferably a plurality of fastener supports may be located in the support portion, the overlap portion, or both of the base plate. The one or more fastener supports may be located proximate to one or more alternative fastener supports. The one or more alternative fastener supports may function to provide an alternative connection location in the event the fastener support aligns with a crack, a recess, a seam, cannot be used to form a connection, or a combination thereof. The one or more alternative fastener supports may be located proximate to and spaced apart from the fastener supports. Preferably, a plurality of fastener supports are located within the overlap portion of the base plate, in a region with fastener supports, proximate to the support portion so that the photovoltaic module is connected to the connection surface.

The connection surface may function to provide support to one or more photovoltaic modules so that a photovoltaic array is formed. The connection surface may be a support structure such as a housing for containing one or more of the photovoltaic modules. Preferably, the connection surface may be a roof. The roof may be made of any material that has sufficient strength to support the weight of the plurality of photovoltaic modules. The roof may be made of any material so that the plurality of photovoltaic modules may be directly connected to the roof. The roof may be comprised of a plurality of panels made of wood, plywood, structural plywood, decorative plywood, overlaid plywood, commercial plywood, utility plywood, marine plywood, medium density fiberboard (MDF), oriented strand board (OSB), Sundela, hardboard, insulation board, the like, or a combination thereof. Alternately, the connection surface may be a series of structural components which do not form a continuous roof surface, such as in the case of a batten type roof structure. The plurality of photovoltaic modules may be connected to the connection surface so that the photovoltaic modules are adjacent to one another. Preferably, the photovoltaic modules may partially overlap each other. For example, the active portion and/or a support portion of one photovoltaic module may overlap an overlap portion of one or more adjacent photovoltaic modules in a similar fashion to how roofing shingles are applied to a roof. Preferably, a support portion of a base plate of one photovoltaic module may extend at least partially over an overlap portion of an adjacent base plate. Each of the base plates may include one or more fastener supports that may connect the base plate to a connection surface.

The plurality of photovoltaic modules and preferably each of the base plates may be connected to the connection surface by any fastener that has sufficient strength to withstand environmental conditions and form a secure connection. The plurality of base plates may be connected to a connection surface with a mechanical fastener, an adhesive, an interlocking connection with an adjacent photovoltaic module, or a combination thereof. The fasteners may be a screw, nail, bolt, staple, or a combination thereof. The adhesive may be epoxy based, silicone based, acrylic based, urethane based, polyamide based, polyolefin based, polyester based, a crosslinked adhesive, a thermoplastic adhesive, a pressure sensitive adhesive, a hot melt adhesive, a block copolymer, a segmented copolymer, a one part adhesive, a multi-part adhesive, a natural adhesive, a synthetic adhesive, or a combination thereof. If an adhesive is used, preferably an adhesive is used so that the pv laminate can be removed from the base plate without damaging the base plate, the pv laminate, or both. Although not preferred an adhesive and a mechanical fastener may be used to connect the pv laminate to the base plate, the photovoltaic module to a connection surface, or both. The adhesives discussed herein may connect an integrated frame to a pv laminate. The fasteners may connect a base plate, a base plate with a photovoltaic laminate, or both to a connection structure.

The base plate may function to provide roofing functions. The base plate may function to connect a photovoltaic laminate (hereinafter pv laminate) to a connection surface (e.g., a roof). The base plate may function to allow for decoupled expansion and contraction of the pv laminate relative to the base plate or vice versa. The base plate may function to allow for removal, replacement, repair, or a combination thereof of the pv laminate without removal of the entire pv module from the connection surface. The base plate may function to protect all or a portion of the pv laminate. The base plate may connect the pv laminate to a connection surface. The base plate may protect one or more connectors. The base plate may include one or more features to assist in forming a connection with one or more connection devices, one or more pv laminates, or both. The base plate may connect to a pv laminate forming an active portion.

The active portion may function to generate electricity when a pv laminate is connected to the base portion. The active portion may be a portion of the pv laminate that is not covered by one or more adjacent photovoltaic modules. The active portion may be a combination of a support portion of the base plate and a pv laminate.

The support portion may function to provide support to a pv laminate. The support portion may support a pv laminate during transportation. The support portion may function to support the pv laminate when a load is applied to the pv laminate when the pv laminate is connected to a connection surface. For example, when the photovoltaic module is connected to a roof and a person walks across the photovoltaic array the support portion may resist bending of the pv laminate so that the pv laminate is not damaged. The support portion may function to provide support for one or more adjacent photovoltaic modules. The support portion of a first photovoltaic module may function to overlap one or more connectors of one or more second adjacent photovoltaic modules so that the one or more connectors of the one or more second adjacent photovoltaic modules are protected. The support portion of a first photovoltaic module may protect one or more connectors that are connected to and extend between two adjacent second photovoltaic modules. The support portion may provide longitudinal support, lateral support, or both so that the pv laminate does not substantially deflect (i.e., enough to crack, break, or be damaged). The support portion may work in conjunction with all or a portion of an integrated frame. For example, an integrated frame may extend around all or a portion of a periphery of the support portion. In another example, an integrated frame may form a connection with a pv laminate and contact a portion of the support portion as the integrated frame extends towards the overlap portion. The pv laminate may be free of a fixed connection with the support portion. The support portion may not provide any sealing functions to the pv laminate. The pv laminate and the support portion may be free of a sealed connection. The support portion may include a connector channel or a portion of a connector channel.

The one or more connector channels may function to receive the one or more connectors of the pv laminate. The one or more connector channels may function to protect the pv laminate connectors from contact, a lateral force, a longitudinal force, an impact, bending, or a combination thereof. The one or more connector channels may assist in forming a connection between a connector (e.g., that connects two adjacent photovoltaic modules) and connector of a pv laminate. The one or more connector channels may receive all or a portion of an integrated frame, a connector, or both. The integrated frame may have a portion that extends into the connector channel. The integrated frame may entirely be located within the connector channel. The one or more connector channels may assist in electrically connecting two adjacent pv laminate connectors. Preferably, the one or more connector channels may be a recess that receives the connector of the pv laminate, all or a portion of an integrated frame, or both. The one or more connector channels may be generally sloped so that the connector channels assist in forming a connection between a connector and a connector of a pv laminate. The one or more connector channels may be located on opposite edges, in opposing edge regions, on opposite sides, or a combination thereof of the base plate. The one or more connector channels may receive all of the connector of the pv laminate. The one or more connector channels may angle downward so that the connector and the pv laminate are on the same plane. The one or more connector channels may be angled so that an integrated frame when connected to the connector may be flush with a surface of the base plate (e.g., the overlap portion).

The one or more and preferably the plurality of pv laminates may be configured in any manner so that each of the plurality of photovoltaic modules may be electrically connected. The pv laminates may include a protective cover (e.g., a glass cover) and pv cells (e.g., an electrical circuit). Each of the individual photovoltaic modules may be electrically connected to an adjacent photovoltaic module by one or more connectors. The one or more connectors may be a ribbon, a positive buss bar, a negative buss bar, a wire, a part of an integrated flashing piece, or a combination thereof. One or more connectors may extend between two adjacent photovoltaic modules and form an electrical connection. The one or more connectors may be a discrete piece that connects two adjacent pv laminates, extend from a pv laminate, or both. The connectors may be a separate piece, a discrete piece, or both that connects two or more adjacent photovoltaic modules, integrated flashing pieces, or a combination of both. The connectors may extend from an active portion of the photovoltaic module, be part of a photovoltaic module, or both. The connectors may be an integral part of a pv laminate.

The photovoltaic laminate may be connected to a base plate, a support portion of the base plate, or both and form an active portion. The pv laminate may be made of any material so that when sunlight is directed on the active portion the sunlight is converted into electricity. The pv laminate may be made of one or more photovoltaic cells having a photoactive portion. Preferably, the pv laminate may be made of a plurality of photovoltaic cells. The photovoltaic cells may be made of any material that assists in converting sunlight into electricity. The photovoltaic cells may be of any type and material known in the art. Some non-limiting examples of materials that the photovoltaic cells may be made of include crystalline silicon, amorphous silicon, cadmium telluride (CdTe), gallium arsenide (GaAs), copper chalcogenide type cells (e.g. copper gallium selenides, copper indium gallium selenides, copper indium selenides, copper indium gallium sulfides, copper indium sulfides, copper indium gallium selenides sulfides, etc. (i.e., known generally as CIGSS)), amorphous silicon cells, crystalline silicon cells, thin-film III-V cells, thin-film II-VI cells, IB-IIIA-chalcogenide (e.g., IB-IIIA-selenides, IB-IIIA-sulfides, or IB-IIIA-selenide sulfides), organic photovoltaics, nanoparticle photovoltaics, dye sensitized photovoltaic cells, and/or combinations of the described materials. In one specific example, the copper indium gallium selenides may be represented by the formula $CuIn(1-x)Ga_xSe(2-y)S_y$ where x is 0 to 1 and y is 0 to 2. For copper chalcogenide type cells, additional electroactive layers such as one or more of emitter (buffer) layers, conductive layers (e.g. transparent conductive layers) or the like maybe used in CIGSS based photovoltaic cells are contemplated by the teachings herein. Other materials and/or combinations are contemplated herein especially those compositions disclosed in paragraph 0054 of U.S. Patent Application Publication No. 2012/0118349, which is incorporated herein by reference as to materials for the active portion. The photovoltaic cells of the photovoltaic laminate may be arranged in parallel, series, mixed series-parallel, and/or may be provided in independent circuits. The photovoltaic laminate may be a combination of layers and may form a pv laminate assembly.

The pv laminate assembly may include one or more of the following components: a forward protective layer, a rearward protective layer, a reinforcement, a photovoltaic cell, a peripheral moisture sensitive edge seal, one or more internal protecting layers, dielectric materials as may be needed to manage the penetration of electrical components outside the laminate, attached connectors and wiring boxes, connector support structures including junction boxes, integrated low profile connectors, encapsulants, moisture resistant back sheets that may optionally include metallized sub layers, or a combination thereof. One example of a pv laminate may include a top layer of glass or a polymeric moisture barrier, an encapsulant layer, an electrical assembly comprising cells, bypass diodes and busses, a rear encapsulant layer, an aluminum based multi-layer back sheet, another encapsulant layer, a rearward protective layer, additional layers around the connector area including a connector support structure, an encapsulant, a dielectric layer, a connector sealant material such as an adhesive with a moisture barrier or another adhesive sealant, the low profile connector attached to the cells with bus terminals, another layer of encapsulant, and another dielectric layer. The rearward protective layer may help protect the laminate from any protrusions or abrasion from the support structure of the base plate. The pv laminate assembly may be free of an encapsulant layer, a rearward protective layer, or both. One or more of the layers discussed herein may be a combination of layers. For example, a forward protective layer may be a combination of multiple glass layers combined together. As another example, the reinforcement may be a plurality of layers bonded together. The layers of pv laminate assembly may be laminated together. The layers of the pv laminate may be sealed at the edges. Preferably, the pv laminate has a peripheral sealed edge that is resistant to fluid penetration. As discussed herein, each individual layer may include an adhesive so that one or more layers are bonded together forming a layer, each layer may include an adhesive over and/or under another layer so that the one or more adjacent layers are bonded together. Other components and layers of the photovoltaic module are contemplated herein that may be used with the reinforcement taught herein especially those components, layers, and/or materials disclosed in Paragraph Nos. 0048-0053 of U.S. Patent Application Publication No. 2012/0118349, and Paragraph Nos. 0027-0038 and FIGS. 2A and 2B 2011/0220183, both of which are expressly incorporated herein by reference as to components, layers, and/or materials for active portions that may be used in conjunction with the reinforcement and photovoltaic module discussed herein. One or more of the layers of the pv laminate may be electrical circuitry. The electrical circuitry may be sealed within the pv laminate.

The electrical circuitry of the photovoltaic laminate may be one or more electrically conducting elements (i.e., buss bars), one or more ribbons (i.e., extend from cell to cell of the pv laminate), or both. The electrical circuitry may extend from cell to cell, photovoltaic module to photovoltaic module, cell to a photovoltaic module, active portion to active portion, or a combination thereof. The electrical circuitry may be integrated into the one or more photovoltaic cells, connect the one or more photovoltaic cells, be electrically connected to the one or more photovoltaic cells, or a combination thereof. The electrical circuitry may be integrated into and/or around one or more layers of the photovoltaic laminate. The electrical circuitry may extend through the photovoltaic laminate, extend partially outside of the photovoltaic laminate so that an electrical connection may be formed, have a portion that is located adjacent to the photovoltaic laminate, or a combination thereof. The photovoltaic laminate may be connected to a support portion of a base plate forming an adjacent portion. The pv laminate may include one or more connectors that are part of the electrical circuitry and extend outside of the pv laminate. The one or more connectors may have a portion that is sealed within the pv laminate and a portion that extends out of the pv laminate.

The one or more pv laminate connectors may function to provide an electrical port for ingress, egress, or both of electricity through each of the pv laminates. The one or more pv laminate connectors may be partially located within the pv laminate and partially extend out of the pv laminate. For example, the pv laminate connector may have a header portion that is external to the pv laminate and two or more terminals that extend into the pv laminate. Each of the pv laminate connectors may include an encapsulant layer (e.g., DNP), a polyolefin encapuslant, an adhesive (e.g., ADCO), a header, terminals, a dielectric layer, protective layers, a header body, a plastic cover, or a combination thereof. All of the layers of the pv laminate may be self-contained and be retained within the pv laminate connector during manufacture. One or more of the layers may flow during manufacture so that the material flows into contact with an adjacent layer and assists in forming a connection with the adjacent layer (e.g., an integrated frame). Preferably, the pv laminate connector and the integrated frame are not directly connected together. The pv laminate, the connectors, or both may be connected to an integrated frame, located partially within an integrated frame, supported by an integrated frame, or a combination thereof. The pv laminate connector may include one or more terminals that extend within the pv laminate and connect the connector to the pv laminate.

The one or more terminals may function to electrically connect the connector and the pv laminate. The one or more terminals may electrically connect a connector to one or more buses so that the terminal functions as an electrical connection point. The one or more terminals may be the only point of connection between a connector and a pv laminate. The one or more terminals may form both an electrical connection and a physical connection between the connector and pv laminate. The one or more terminals may extend into the pv laminate so that the connector forms a cantilever connection with the pv laminate. The one or more terminals may be located adjacent to one or more engagement devices so that the one or more engagement devices align the one or more terminals within the photovoltaic module, align the connector relative to the photovoltaic module, align the connector relative to an integrated frame, or a combination thereof.

The one or more engagement devices may function to align a connector relative to a pv laminate, an integrated frame, one or more buses of a polarity, or a combination thereof. The one or more engagement devices may function to prevent lateral movement, longitudinal movement, rotational movement, or a combination thereof of the connector, the integrated frame, or both relative to each other or relative to a pv laminate. The one or more engagement devices may be located in one or more locations on the connector. The one or more engagement devices may be an integral part of the clip (i.e., a permanent part). The one or more engagement devices may be added to the connector (e.g., a header clip). The one or more engagement devices may mirror a shape of an engagement feature. The one or more engagement devices may be asymmetrically located on the connector, extend from the connector, or both. The one or more engagement devices may be a plurality of engagement devices that all cooperate together. The one or more engagement devices may be located on one or more sides, on opposing sides, on one or more edges, on a top, bottom, left, right, or a combination thereof. The one or more engagement devices may be one or more projections, one or more header clips, one or more retention projections, a platform, one or more flares on the one or more header clips, or a combination thereof.

The one or more projections may function to align the connector relative to an integrated frame. The one or more projections may function to align the connector so that the connector, the integrated frame, or both may only be connected to the pv laminate in a single configuration. The one or more projections may function so that the connector and integrated frame may be assembled in a single configuration. The one or more projections may be asymmetrical. Preferably, a plurality of projections extend from the connector and the plurality of projections are asymmetrically located on the connector, extend from the connector, or both. For example, one projection may extend further from the connector than another projection. The length of the projections may signify a polarity. For example, a longer projection may signify a positive terminal and a shorter projection may signify a negative terminal. The one or more projections may have a different length, shape, width, diameter, height, or a combination thereof. The one or more projections may extend out from the connector so that the projections are located in a line, out of a line, on a same side of the connector, on opposing sides of the connector, are staggered, on only one side, project from an edge project form a side (e.g., a face of the connector), or a combination thereof. The one or more projections may have a first side and a second side (e.g., left handed and right handed). The one or more projections may form a complementary fit to an ear of an integrated frame. The one or more projections may have a length of about 1 mm or more, about 2 mm or more, or even about 5 mm or more. The one or more projections may have a length of about 30 mm or less, about 20 mm or less, or about 15 mm or less. One projection may have a length that is about 1 mm or more, about 2 mm or more, about 3 mm or more, or even about 5 mm or more than an opposing projection. The one or more projections may assist in connecting, aligning, or both a header clip to the connector. The one or more projections may be used in conjunction with one or more retention projections.

The one or more retention projections may function to retain the connector within the integrated frame, a header clip on the connector, within the integrated frame, or a combination thereof. Preferably, the one or more retention projections function to laterally, longitudinally, rotationally, or a combination thereof restrain the header clip on the connector. More preferably, the one or more retention projections extend from the connector and through a portion of the header clip. The one or more retention projections may extend into retention slots of the integrated frame. A retention wall may extend between the retention projections so that the header clip is sandwiched between the connector and the integrated frame. The one or more retention projections may extend laterally outward from the connector and assist in restraining the header clip on the connector. Preferably, the connector includes a plurality of retention projections. More preferably, two opposing sides of the connector include a plurality of opposing retention projections. The retention projections may be smaller than the projections. The retention projections may have a sufficient length to extend partially and/or fully through a header clip. The header clip may form a connection with an opposing connector and the retention projections may prevent the header clip, the opposing connector, or both from being disconnected by pulling on one of the connectors. The header clip may be sandwiched between the retention projections and the retention slots so that the header clip is fixed to the connector, within the integrated frame, or both.

The header clip may function to connect two or more connectors together. The header clip may align two clips together. The header clip may prevent the connectors from being disconnected without a tool, user interaction, or both. The header clip may lock the connector within the integrated frame. The header clip may guide a second connector into the connector so that a physical connection, an electrical connection, or both are formed. The header may include a platform (e.g., a body portion), or one or more flared portions (i.e., flared header clips).

The one or more flared header clips (i.e., flares) may function to connect two connectors together. The one or more flares may function to guide an adjacent connector into the connector so that a fixed connection, an electrical connection, or both are created between the connector and the adjacent connector. The one or more flares may taper outward, open outward, or both. For example, the one or more flares may extend outward away from longitudinal axis that bisects two halves of the connector. The one or more flares may assist in forming a proper connection. The one or more flares may assist in locking the two connectors together. For example, the connector may include tabs that extend into a portion of an adjacent connector and once the connection is formed the flares may cover the tabs and prevent the connector from being removed. The one or more flares may extend from a body portion or a platform of the header clip, and preferably one flare extends from each side and/or edge of the platform.

The one or more platforms may be a main portion of the header clip. The one or more platforms may function to connect the header clip to the connector. The one more platforms may wrap around the connector so that the two opposing flares are connected to the same unitary piece. The one or more platforms may receive the retention projections so that the header clip is fixed to the connector. The one or more platforms may include through holes on the sides for receiving one or more retention projections, projections, or both. The one or more platforms may wrap around the connector so that an integral connection is formed. The one or more platforms may be generally "U" shaped. The one or more platforms may substantially mirror the shape of the connector, the integrated frame, or both.

The one or more integrated frames may function to protect a connector, one or more edges of a pv laminate, or both. The one or more integrated frames may function to align the connector within a manufacturing assembly (e.g., a lamination assembly and/or lamination frame). The integrated frames may function to prevent damage to electrical conducting elements, wires, buses, terminals, or a combination thereof during manufacturing, transportation, installation, due to environment (e.g., wind, water, debris), maintenance of the photovoltaic array, or a combination thereof. The integrated frames may function to prevent movement of the connector during formation of the pv laminate, during attachment of the pv laminate to the base plate, during transportation of the pv laminate, during transportation of the photovoltaic module, or a combination thereof. The integrated frames may form a cantilever connection with the pv laminate. The integrated frames may connect to a pv laminate and extend over the connector. The integrated frame may have one anchored end and one free end. The integrated frame may connect to a pv laminate and contact the connector channel so that the connector is located under the integrated frame and is protected between the base plate (e.g., the connector channel) and the integrated frame. Two integrated frames may be connected to the pv laminate. A single integrated frame may extend over all of the connectors of the pv laminate. A single integrated frame may be connected to the pv laminate. An integrated frame may be located proximate to each connector. A plurality of integrated frames may be part of each photovoltaic module. Each pv laminate connector may be covered by a discrete integrated frame. For example, if the pv laminate includes two connectors then each connector may include an integrated frame. The integrated frame may extend around a periphery of the pv laminate. The integrated frame may extend along one or more sides, one or more edges, or both of the pv laminate. The integrated frame may be connected to one or more sides and/or one or more edges of the pv laminate. The integrated frame may be multiple discrete pieces that connect to the pv laminate and protect the connectors. The integrated frame may include a cover that extends partially and/or fully over the connector.

The cover may function to extend over all or a portion of the connector. The cover may function to prevent movement of the connector away from the base plate. The cover may function to protect the connector from direct contact with environmental conditions (e.g., hail, rain, flying debris). The cover may extend beyond an end of the connector and assist in forming a connection with an adjacent connection mechanism (i.e., a connector that extends between two adjacent pv laminates). Each integrated frame preferably includes at least one cover and the cover is a portion that extends over all or a portion of a connector extending from the pv laminate. The cover may form a flat surface for a portion of an adjacent photovoltaic module to rest on, contact, overlap, or a combination thereof. The cover may provide support to a person stepping on the photovoltaic module. The cover may be a part that extends cantilever over the connector, extends over a connector and is supported on one or more sides, or both. The cover may prevent a person from stepping directly on the connector. The cover may extend from an edge of a pv laminate. The cover may be connected to or be part of an integration portion.

The one or more integration portions may function to form a connection with a pv laminate. The one or more integration portions may form a cantilever connection with a pv laminate. The integration portion may form a connection and support the integrated frame so that the cover extends cantilever from the pv laminate. The one or more integration portions may be integrated into the pv laminate, connected to the pv laminate, or both. Preferably, the integration portions are connected to an outer layer of the pv laminate. More preferably, the integration portions are connected to a layer of glass on an outside of the pv laminate. The integration portion may extend between layers of the pv laminate. The one or more integration portions may cover a portion of a pv laminate. The integration portions and the covers may be two discrete pieces. Preferably, the integration portion and the cover are one piece and the integration portion extends over the pv laminate to form a connection and the cover extends over the connector. The one or more integration portions may overlap the pv laminate and create a connection with the pv laminate. The integration portion may form a connection with the pv laminate by an adhesive, an encapsulant, or both. The connection region of the integration portion may form a fixed connection with the pv laminate. The integration portion may form a connection with the pv laminate that is sufficiently strong so that the integrated frame is resistant from being removed from the pv laminate. The integration portion may form a connection with the pv laminate that is sufficiently strong that the pv laminate withstands a force of about 0.55 MPa (80 psi) or more, about 1.1 MPa (160 psi) or more, about 2.2 MPa (320 psi) or more when measured using a removal test as is discussed herein. The removal test method places a pv laminate including a connected integrated frame into a stand to support the pv laminate. A weight is applied to the pv laminate to prevent the pv laminate from rotating or moving off of the stand and then an actuator applies a force to a terminal end of the integrated frame furthest from the edge of the laminate. The actuator includes a ⅜" diameter hemispherical tip and the actuator is connected to a load cell. The actuator moves downward at a rate of 1 in/min until bond between the integrated frame and the pv laminate breaks. The load peak of the load cell is recorded so that the maximum force is determined. The integration portion may be connected to the pv laminate using one or more fasteners that are discussed herein and which may be used to connect other components of the pv laminate, lamination frame, assembly, or a combination thereof together.

The fasteners may function to create a connection without damaging the pv laminate, impeding creation of electricity by the pv laminate, reducing the exposed surface area of the pv laminate, or a combination thereof. The fastener may be a mechanical connector that connects the integrated frame to the pv laminate. The mechanical connection may be heat bonding, pressure bonding, heat staking, heat bonded lamination, melting, or a combination thereof. The mechanical connection may be a mechanical fastener a screw, bolt, rivet, nail, threaded fastener, or a combination thereof. Preferably, the fastener is an adhesive. The adhesives may be an epoxy, hot melt, tape, pressure sensitive adhesive (e.g., tape), epoxy based, silicone based, acrylic based, urethane based, polyamide based, polyolefin based, polyester based, a crosslinked adhesive, a thermoplastic adhesive, a block copolymer, a segmented copolymer, a one part adhesive, a two part adhesive, a multi-part adhesive, a natural adhesive, a synthetic adhesive, or a combination thereof. Preferably, the adhesive is a polyolefin based adhesive. The adhesive may function to bond two dissimilar materials together. For example, the adhesive may bond plastic to glass. The adhesive may be a softening and/or flow of a material of the pv laminate into contact with the integrated frame so that a fixed connection is formed therebetween. The one or more adhesives may assist in increasing the strength of a mechanical fastener, a mechanical connection, or both so that the integrated frame is connected to the pv laminate by the integration portion. The one or more fasteners may form a connection between the integration portion and the pv laminate at a connection region.

The connection region may function to receive one or more fasteners and create a connection. The connection region may function to integrally connect the integrated frame to the pv laminate. The connection region may have an area that is part of and/or the same size as the integration portion. The connection region may include one or more recesses for receiving adhesive. The connection region may have features that include an increased surface area (e.g., grooved, dimpled, recessed, channels) for assisting in strengthening a connection when compared to a connection region that does not include features that increase surface area (e.g., smooth). The connection recesses may include one or more grooves that allow adhesives, encapsulant, material of the pv laminate, material of the integrated frame, or a combination thereof to flow and create a fixed connection between the pv laminate and the integrated frame. The connection region may be a part of the integration portion that does not include any pieces extending from the sides and/or edges (e.g., step extensions and/or extensions). For example, the connection region is substantially planar and does not include any portions extending there from towards the pv laminate so that a fixed connection is formed. The connection region may be substantially planar. The connection region may terminate at one or more ledges, one or more step extensions, one or more extensions, or both.

The one or more step extensions (hereinafter step), one or more extensions, or both may function to support the integrated frame over, above, or both the connector. The one or more steps, one or more extensions, or both may function to provide support to the cover, the integration portion, or both. The one or more steps, one or more extensions, or both may extend from an edge, an edge region, or both and provide support to the integrated frame so that a substantially constant gap is created between the integrated frame and the base plate. The one or more extensions, one or more steps, or both may form a connector recess through the integrated frame so that a connector can extend through the connector recess. The one or more steps, one or more extensions, or both may provide support to the cover, the integration portion, or both. The one or more steps, one or more extensions, or both may maintain a connector recess that the connector extends through so that when a force is applied to the photovoltaic module the connector recess protects the pv laminate connector. The one or more steps, one or more extensions, or both may be substantially the same size and shape and provide substantially the same amount of support to the integrated frame. The one or more steps, one or more extensions, or both may have a portion that extends from each side and/or edge of the integrated frame. The one or more steps, one or more extensions, or both may extend from opposing sides and/or edges, a single side and/or edge, a plurality of sides and/or edges, or a combination thereof.

The one or more steps, one or more extensions, or both may extend towards the base plate, into contact with the base plate, into contact with the pv laminate, or a combination thereof. The one or more extensions may support the cover, the integration portion, or both. The one or more steps may be shorter than the one or more extensions. The one or more steps may progressively change in length to form a complementary shape to the pv laminate and its associated components, the base plate, or both. The one or more steps may contact the pv laminate so that only the connector recess (and portions that form the connector recess) extends over the pv laminate. The one or more steps may extend away from the integration portion at an angle so that a portion (e.g., a vertical portion (i.e., ledge)) of the steps contact an edge of a pv laminate and assists in forming a connection, prevents movement of the integration frame longitudinally over the pv laminate, or both. The one or more steps may create a stop and contact with a portion of the base plate to support the integrated frame. The one or more steps may create a stop and include a connection surface for connecting the integrated frame to the pv laminate. The one or more steps may be located proximate to a ledge, include a ledge, or both.

The one or more ledges may function to create a stop. The one or more ledges may separate the cover and the integration portion. The one or more ledges may function to assist in aligning the integrated frame with the pv laminate, the base plate, or both. The one or more ledges may function to create contact between the integrated frame and the base plate. Preferably, in an installed position the one or more ledges contact the pv laminate and position the integrated frame relative to the pv laminate. The one or more ledges may form a bridge between a step extension and an extension. The one or more ledges may be an intermediate step between the step extension and the extension. The one or more ledges may be a vertical portion and/or wall of a step. The one or more ledges may elevate all or a portion of the integrated portion above the base plate so that a connector recess is created under the integrated frame.

The one or more connector recesses may function to create a space for a connector. The one or more connector recesses may function to create a protected location for the connector. The one or more connector recesses may function to assist in forming a connection between two or more connectors. The one or more connector recesses may substantially surround a connector, be a space that the connector extends through so that the connector is surrounded by the integrated frame, or both. The one or more connector recesses may be formed by the integrated frame extending around two or more sides, three or more sides, or even four or more sides of a connector. The connector recesses may include an open end for receiving a connector. The connector recesses may extend under the cover, a part of the integration portion, or both. The connector recess may extend between two or more opposing steps, extensions, or both. The connector recess may be a through hole, an absence of material, or both. The walls of the integrated frame that form the connector recesses may prevent the connector from moving laterally, moving longitudinally, being bent, terminals of the connector being bent, a connection between two connectors being disconnected, or a combination thereof. The walls extending about the connector recess may contact all or a portion of a connector so that the connector is aligned relative to the pv laminate, the connector is positioned within a lamination frame, within a laminator, or a combination thereof. The connector recess may be configured so that the connector can only be installed within the connector recess in a single configuration. One or more engagement features may assist in forming the connection between the connector and the integrated frame and facilitating installation between the two devices.

The one or more engagement features may function to align the connector relative to the integrated housing. The one or more engagement features may function to prevent movement (e.g., longitudinal, lateral, rotational, or a combination thereof) of the connector relative to the integrated frame or vice versa. The one or more engagement features may align the connector within the integrated frame so that the installation position of the connector, the integrated frame, or both relative to the pv laminate are the same every time. The engagement features may function to assist in aligning the terminals relative to the pv laminate so that the terminals align with the proper buses (e.g., the positive terminals align with the positive bus and the negative terminal aligns with the negative bus). The engagement features may be located on the walls, sides, edges, ends, or a combination thereof of the integrated frame. The one or more engagement features may be a disengagement opening, flared extension, ears, retention slots, retention walls, receiving pocket, central recess, or a combination thereof.

The one or more disengagement openings may function to permit access to an internal location of the integrated frame. The one or more disengagement openings may function to permit a user, a tool, or both access into the connector channel. Preferably, the disengagement openings may permit access to the flares of the header clips. The one or more disengagement openings may be cutouts in the integrated frame. The one or more disengagement openings may be an absence of material. The one or more disengagement openings may be located at a terminal end. Preferably, there are two disengagement openings at a terminal end of the integrated frame. More preferably, each of the disengagement openings are located proximate to a flare so that the flare of the header clip can be accessed. The one or more disengagement openings may be located in a center, on an edge, in an edge, in a middle, on a side, in a side, or a combination thereof of an integrated frame. The one or more disengagement openings may be located so that a user has access to one or more flares through the disengagement openings. The one or more disengagement openings may be located proximate to one or more flared extensions.

The one or more flared extensions may function to open outward to mirror a shape of a flare of a header clip so that the header clip is protected. The one or more flared extensions may protect the flares of the header clip. The one or more flared extensions may include one or more steps. The one or more steps may gradually move outward away from a line that extends along a longitudinal axis of the integrated frame and bisects the integrated frame. The integrated frame may include a plurality of flared extensions. The integrated frame may include a pair of opposing flared extensions. The flared extensions may be reverse mirror images of each other. The flared extensions may be complementary to the flares of the header clips. The flared extensions may include one or more straight sections that step outward so that the integrated frame extends outward. The flared extensions may begin proximate to the retention slots and extend longitudinally away from the connection region, the pv laminate, or both.

The one or more retention slots may function to receive a retention projection. The one or more retention slots may function to retain a header clip within the integrated frame, prevent movement of the header clip, or both. The one or more retention slots may be a recess in a wall, a slot, a dimple, or a combination thereof. The one or more retention slots may be complementary in size and shape to the retention projections. The one or more retention slots may be located in the walls of the extension. The one or more retention slots may be located on one or both sides, or on one or both edges (e.g., a vertical side wall of the integrated frame). Preferably, the integrated frame includes a plurality of retention slots. More preferably each side of the integrated frame includes a plurality of retention slots. Each side of the integrated frame may include two retention slots. The retention slots may be sufficiently large that the retention slots receive the retention projections that extend through the header clip. The retention slots may be separated by one or more retention walls.

The one or more retention walls may function to prevent the header clip from being removed from the retention projections. The one or more retention walls may function to sandwich the header clip between the integrated frame and the connector. The retention walls may extend outward towards the connector. The retention wall may be parabolic shaped, "U" shaped, have steep walls (e.g., a slope of 1 or greater), have a low slope (e.g., a slope of 1 or less), or a combination thereof. The retention walls may be rounded, have one or more flat portions, terminate at a point, have a round point, have a flat end, or a combination thereof. The one or more retention walls may be a single piece that extends from the wall without the wall itself extending outward. The retention walls may be substantially the same size (e.g., length) as the retention projections. The retention wall may be located proximate to the ears.

The one or more ears may function to receive the projections. The one or more ears may function to align the integrated frame and the connector. The one or more ears may function to provide a single way to connect the connector and the integrated frame. The one or more ears may be asymmetrically sized and shaped. The one or more ears may mirror the size and shape of the projections. For example, one ear may fit both projections and one ear may only fit one projection. The one or more ears may be located on opposing sides, opposing edges, the same side, adjacent a major surface of the connector, in a line, staggered, out of a line, or a combination thereof of the integrated frame. The one or more ears may prevent lateral movement, longitudinal movement, rotational movement, or a combination thereof of the integrated frame relative to the connector. The one or more ears may be located proximate to the connection recess. The one or more ears may include a through hole. Preferably, the one or more ears may be a recess that receives a projection and cradles the projection so that the projection is retained in place by the ear. The one or more ears may have an arcuate portion that receives the projection, may be flat, or both. The one or more ears may be located on opposing sides of a pocket.

The one or more receiving pockets may function to receive the platform of the header clip. The one or more receiving pockets may function to prevent movement of the header clip, the connector, or both relative to each other and the integrated frame. The one or more receiving pockets may receive the platform so that the connector is flush within the integrated frame. The one or more pockets may function to align the header clip within the integrated frame so that the header clip and the connector both self-align within the integrated frame. The one or more pockets may be located in a connector recess, proximate to the one or more alignment recesses, or both. The connector recesses may include one or more alignment recesses and preferably a plurality of alignment recesses.

The walls defining the one or more alignment recesses may function to align one or more terminals, one or more terminal covers, one or more alignment portions of a connector, or a combination thereof. The walls extending about the one or more alignment recesses may function to protect one or more terminals. The walls forming the one or more alignment recesses may align one or more terminals to one or more connectors. The walls forming the one or more alignment recesses may sandwich one or more and preferably a plurality of terminals between the integration frame and the pv laminate, the base plate, or both. The one or more alignment recesses may function to receive a protrusion of a connector, an alignment portion of a connector, or both. The one or more alignment recesses may function to prevent the connector from moving relative to the integrated frame. The one or more alignment recesses may prevent lateral movement, longitudinal movement, or both of the connector. The one or more alignment recesses, may laterally align, longitudinally align or both the connector relative to the integrated frame, the pv laminate, or both. The one or more alignment recesses may include one or more central recesses. The one or more central recesses may be larger than the alignment recesses. The one or more central recesses may perform any of the functions of the alignment recesses. The one or more central recesses may accommodate one or more structures of the connector. The one or more central recesses may be located between two alignment recesses. The one or more alignment recesses may be used in conjunction with one or more alignment cavities.

The walls forming the one or more alignment cavities may function to prevent movement of the connector relative to the integrated frame. The walls defining the shape of the one or more alignment cavities may function to align a connector within a lamination frame, within the integrated frame, or both. The walls defining the shape of the one or more alignment cavities may function to only allow a connector to be placed in the integrated frame in a single configuration. Each of the one or more alignment cavities may have a different shape and size. For example, one alignment cavity may be generally rectangular and one alignment cavity may include a shape with an arcuate segment. The alignment cavities may be mirror images. The alignment cavities may be formed in the step extensions, the extensions, or both. The alignment cavities may be formed in a wall of the step, the extension, or both that is located between the cover and/or integration portion and the base plate, the pv laminate, or both. The alignment cavities may receive an ear of a connector, a protruding portion of a connector, or both. The walls forming the alignment cavities may extend around one or more sides, one or more ends, or both of a connector, an ear of a connector, or both. The alignment cavities may be an absence of material, a recess formed within material and/or a wall, or both. The alignment cavities may be generally "C" shaped. The alignment cavities may extend around a distal end and a proximal end of an ear of a connector so that the alignment cavity prevents movement distally or proximally relative to the ends of the integrated frame. The alignment cavities may only allow for a connector to be vertically installed within the integrated frame. The alignment cavities of the integrated frame may hold the connector in a specific position so that all or a portion of the integrated frame is aligned to the connector. The integrated frame may be made of the same material as the base plate. The integrated frame base plate, or both may be made of a polymeric composition.

The polymeric composition may be any polymeric composition that may be flowable, have high electrical insulating properties, fluid impermeable, high flexibility, low creep, low modulus, fire retardant, or a combination thereof. Some polymeric compositions that may be used with the photovoltaic module taught herein are an elastomer, thermopolastic, thermosetting polymer, or a combination thereof. The polymeric composition may include a filled or unfilled moldable plastic, polyolefins, acrylonitrile butadiene styrene (SAN), hydrogenated styrene butadiene rubbers, polyester amides, polysulfone, acetal, acrylic, polyvinyl chloride, nylon, polyethylene terephthalate, polycarbonate, thermoplastic and thermoset polyurethanes, polyethylene, polystyrene, synthetic and natural rubbers, epoxies, polystyrene, thermoplastic elastomer (TPO, TPE, TPR), polyamides, silicones, vinyl based resins, or any combination thereof. The polymeric composition may be free of fillers, fibers, reinforcing materials, or a combination thereof. The polymeric composition may include fillers such as colorants, fire retardant (FR) or ignition resistant (IR) materials, reinforcing materials, such as glass or mineral fibers, surface modifiers, or a combination thereof. The polymeric composition may also include anti-oxidants, release agents, blowing agents, and other common plastic additives. Examples of suitable polymeric compositions are found in U.S. Patent Application Publication No. 2011/0100438 the contents of which are expressly incorporated by reference herein for the polymeric compositions.

FIG. 1 illustrates a perspective view of a photovoltaic module 2. The photovoltaic module 2 includes a base plate 6 that has an overlap portion 10 and an active portion 4. The overlap portion 6 includes molded in handles 40 for carrying the photovoltaic module 2, and connection recesses 42 for forming a connection with adjacent photovoltaic modules 2. Adjacent to the connection recesses 42 are located a plurality of fastener locations 50 for connecting the photovoltaic module 2 directly to a surface such as a roof. Opposing edges of the base plate 6 include connector channels 16 for receiving a connector 82 of a photovoltaic laminate 80. The connectors 82 are covered by an integrated frame 20 that protects the connectors 82 from damage and especially bending. The photovoltaic module 2 includes an active portion 4 that includes a photovoltaic laminate 80. A plurality of locking features 14 connect the photovoltaic laminate 80 to the support portion 8 of the base plate 6.

Figure 2:
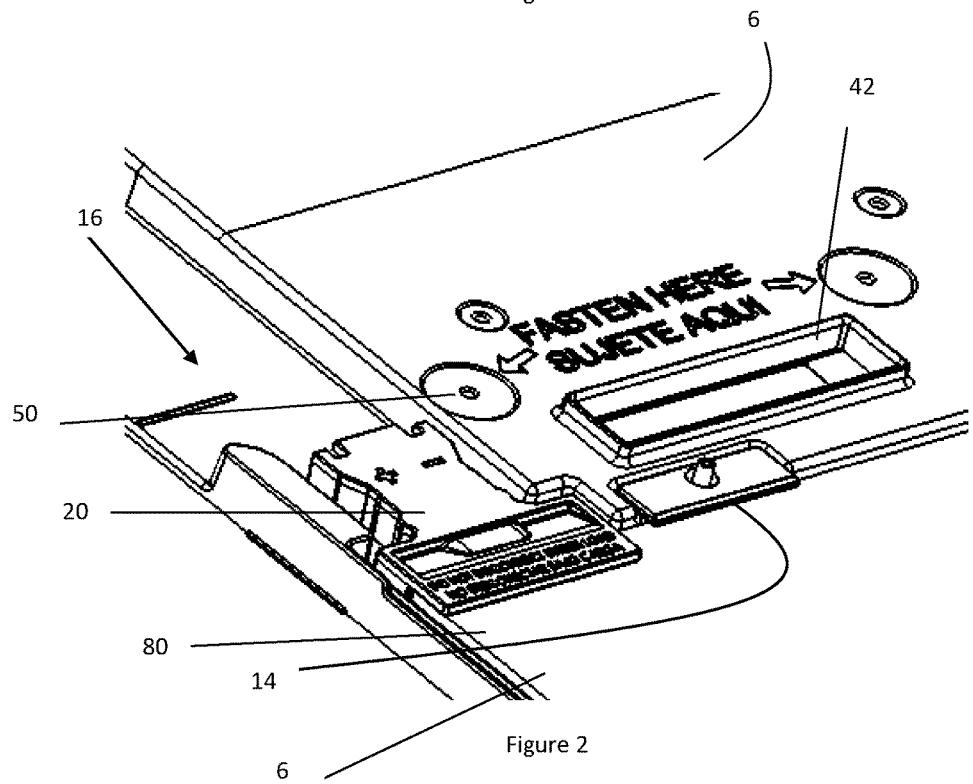
FIG. 2 illustrates a close-up view of an integrated frame of FIG. 1.

FIG. 2 illustrates a close-up view of the integrated frame 20 of FIG. 1. The integrated frame 20 is located in a connector channel 16 and is connected to a photovoltaic laminate 80 using an overlapped joint and adhesive. The photovoltaic laminate 80 is connected to the base plate 6 by a locking feature 14. The base plate 6 includes a connection recess 42 that extends through the base plate 6 to form a connection with an adjacent photovoltaic module. A fastener location 50 is located proximate to the connection recesses 42 for connecting the base plate 6 to a roofing member (not shown).

Figure 3:
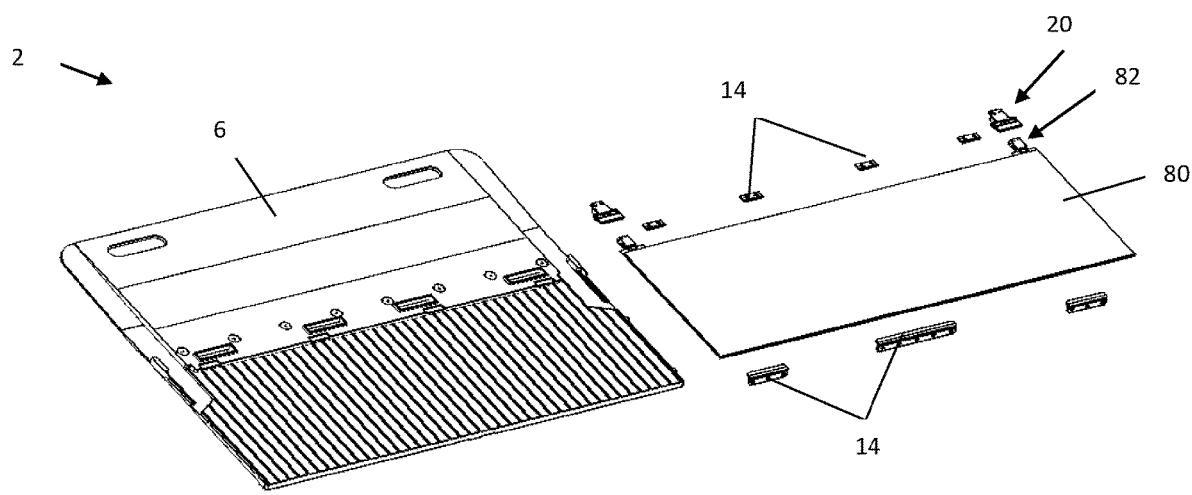
FIG. 3 illustrates an exploded view of a photovoltaic module.

FIG. 3 illustrates an exploded view of a photovoltaic module 2. The photovoltaic module 2 includes a base plate 6. A photovoltaic module 80 includes a pair of opposing connectors 82 that are each covered by an integrated frame 20 so that the connectors 82 are protected. A plurality of locking features 14 connect the photovoltaic laminate 80 to the base plate 6.

Figure 4:
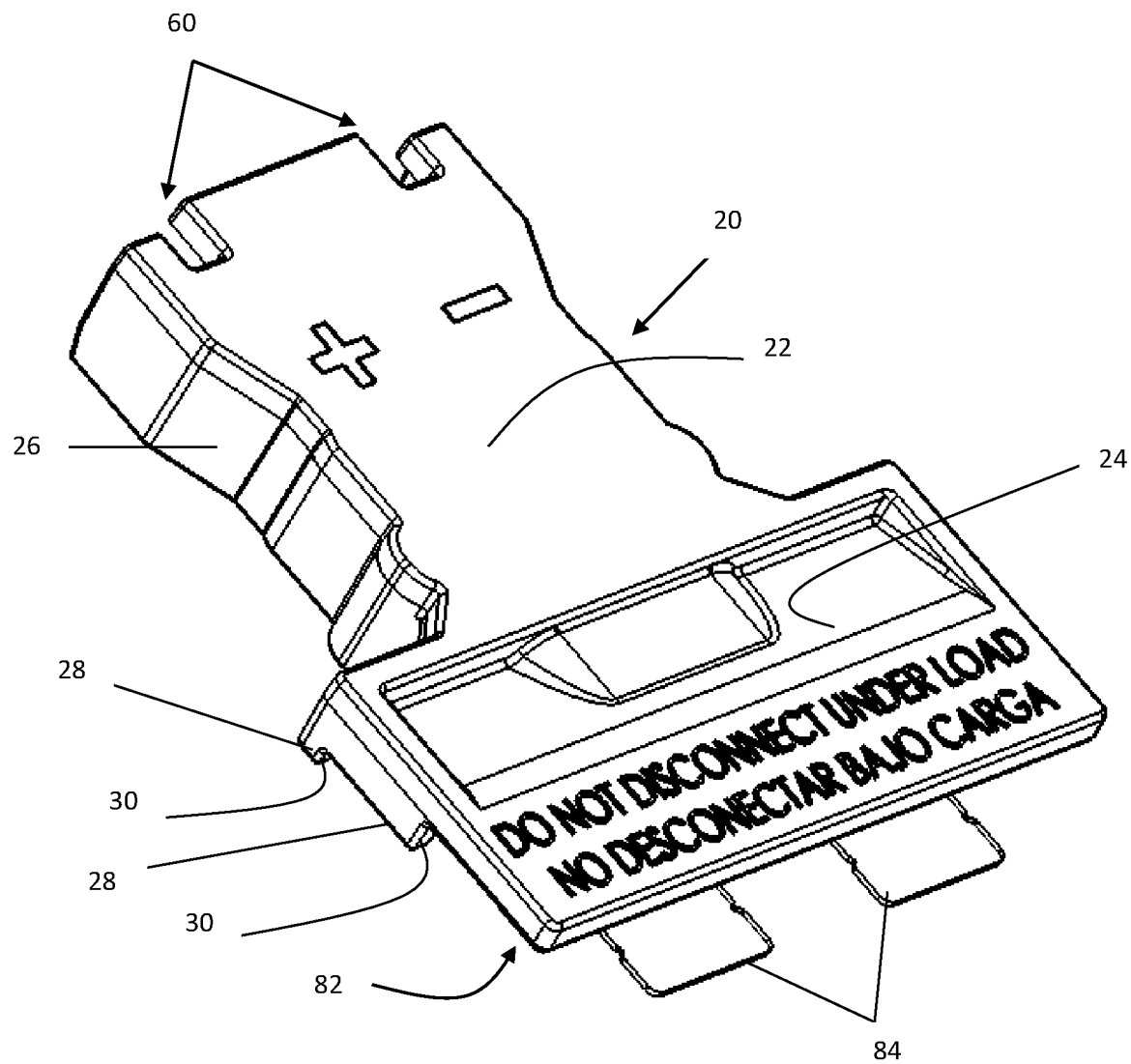
FIG. 4 illustrates a top perspective view of an integrated frame.

FIG. 4 illustrates a top perspective view of an integrated frame 20 and connector 82. The integrated frame 20 covers and protects the connector 82 and the terminals 84 of the connector 82 extend beyond the integrated frame 20 so that the connector 82 forms an electrical connection with the photovoltaic laminate 80 (not shown). The integrated fame 20 further covers the connector 82 so that the terminals 84 are protected from being damaged. The integrated frame 20 includes disengagement openings 60 that allow access so that the connector 82 and the integrated frame 20 can be disconnected from an adjacent photovoltaic laminate (not shown). The integrated frame 20 has a cover 22 and an integration portion 24 that form an upper surface over the connector 82. An extension 26 extends from the cover 22 so that the sides of the connector 82 are protected. Step extensions 28 extend from the integration portion 24 so that the step extensions 28 form a connection with an adjacent component such as a photovoltaic laminate (not shown). The step extensions 28 each include a ledge 30 that may contact one or more features of the photovoltaic laminate (not shown) and assist in forming a connection.

Figure 5A:
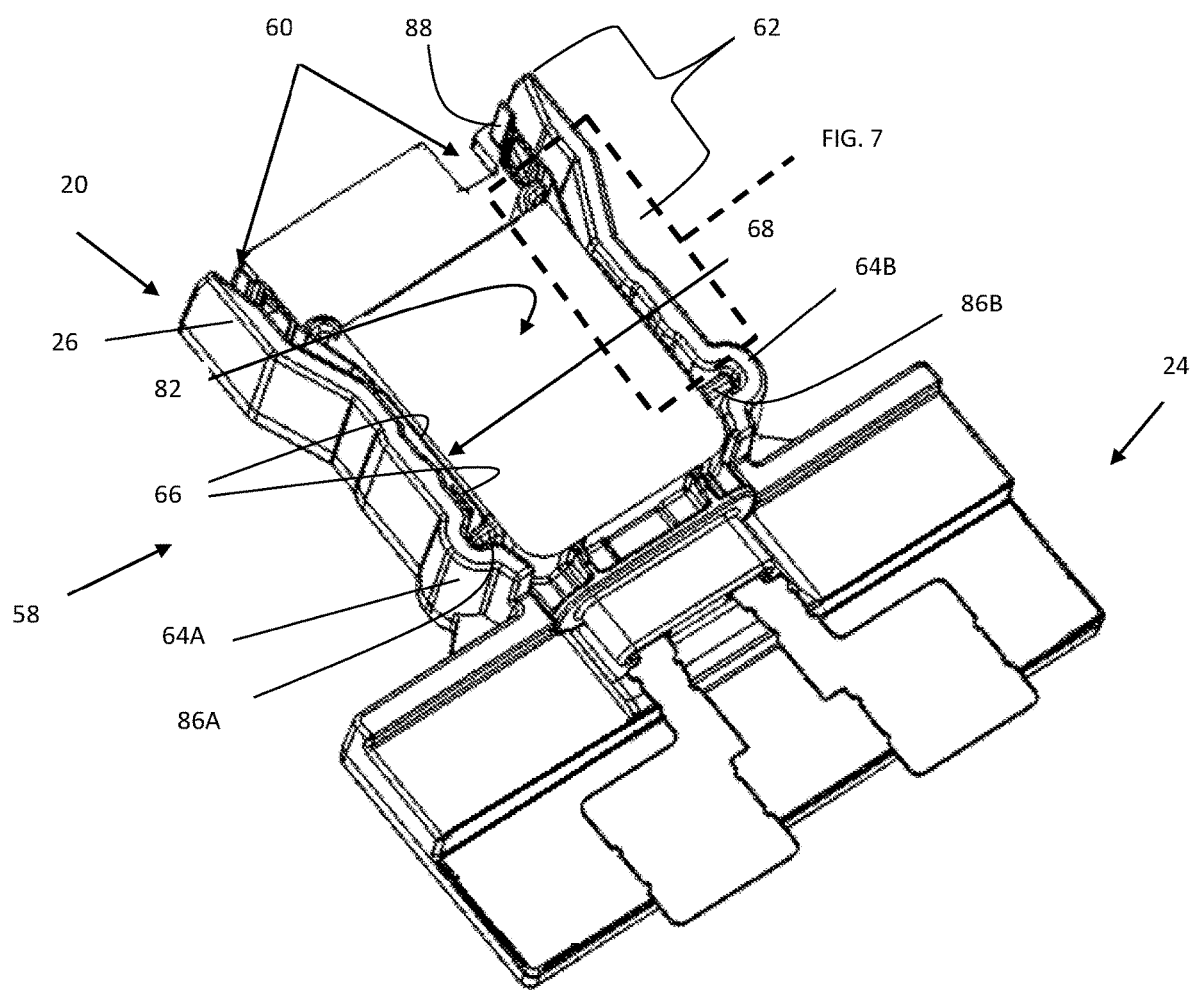
FIG. 5A illustrates a bottom perspective view of an integrated frame including a connector.

FIG. 5A illustrates a bottom perspective view of FIG. 4. The integrated frame 20 is housing the connector 82. The integrated frame 20 as shown includes a plurality of engagement features 58 that facilitate in forming and maintaining a secure connection between the integrated frame 20 and the connector 82. As shown the end of the extension 26 includes a flared extension 62 that opens outward to receive the flared header clips 88 of the connector 82. The flared extension 62 and the flared header clips 88 are complementary with each other so that the flared header clips 88 are protected. The disengagement openings 60 allow for a user to actuate the flared header clips 88 to disconnect the connector 82. The extensions 26 also include retention slots 66 on each side that receive retention projections 90 (not shown) on the connector 82. The retention slots 66 on each side are separated by a retention wall 68 that prevents longitudinal movement of the integrated frame 20 and the connector 82 relative to each other. The extensions 26 also include ears 64 on opposing sides that receive projections 86. As shown the ears 64A and 64B are asymmetrical to receive complementary asymmetrical projections 86A and 86B respectively. The projection 86B will only fit in each 64B as projection 86B is longer than 86A. The integration portion 24 receives a bonding agent (not shown) and assists in forming a connection.

Figure 5B:
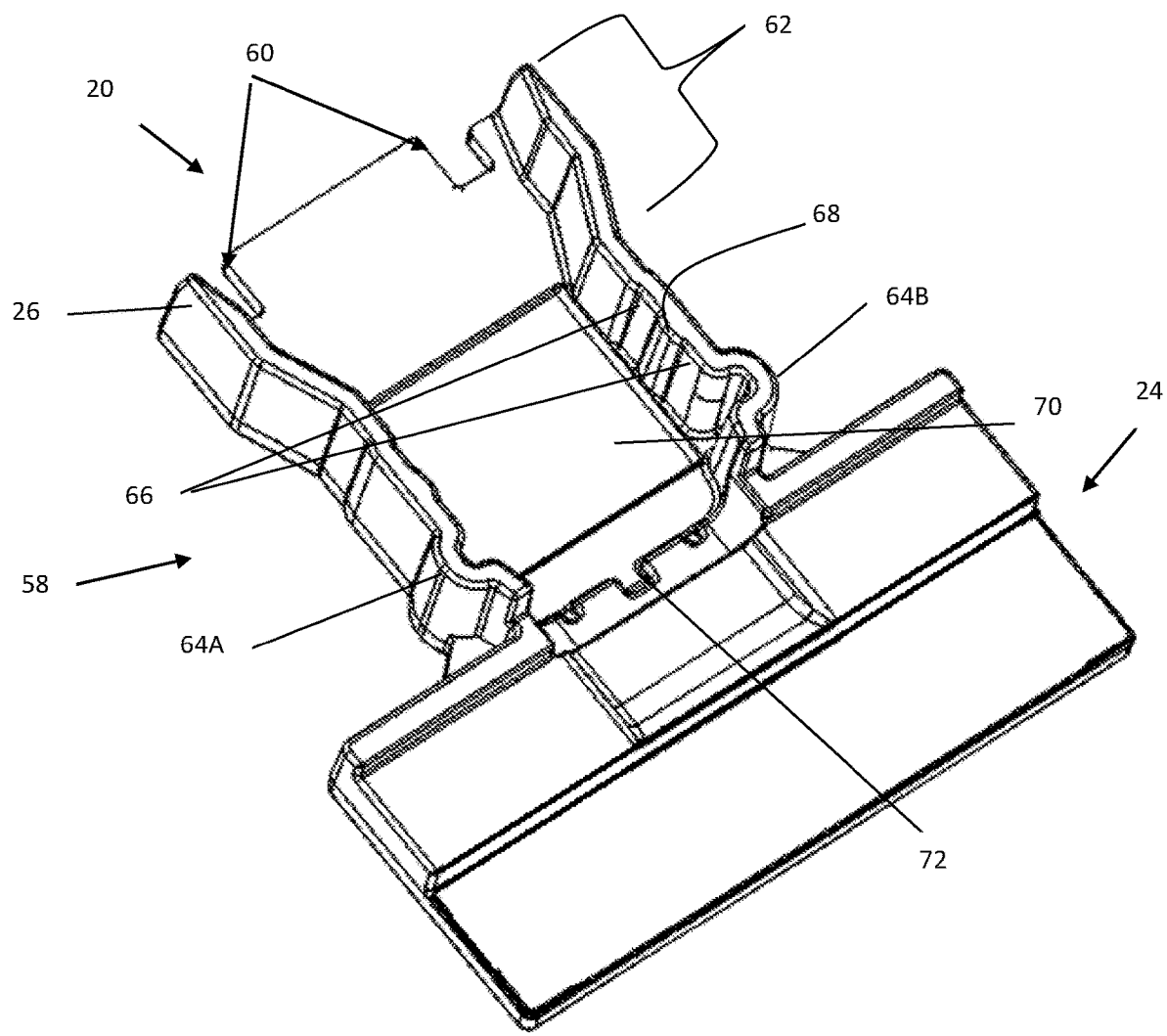
FIG. 5B illustrates a bottom perspective view of an integrated frame.

FIG. 5B illustrated the integrated frame 20 of FIG. 5A with the connector removed so that the engagement featured 58 are more visible (e.g., flared extensions 62, ears 64, retention slots 66, retention walls, 68, receiving pockets 70, and central recesses 72). The integrated frame 20 includes disengagement openings 60 at the ends to assist in removing a connector. The extensions 26 each include flared extensions 62, retention slots 66, and a retention wall 68 between the retention slots 66. The extensions 26 also include ears 64A and 64B that are asymmetrical.

Figure 6A:
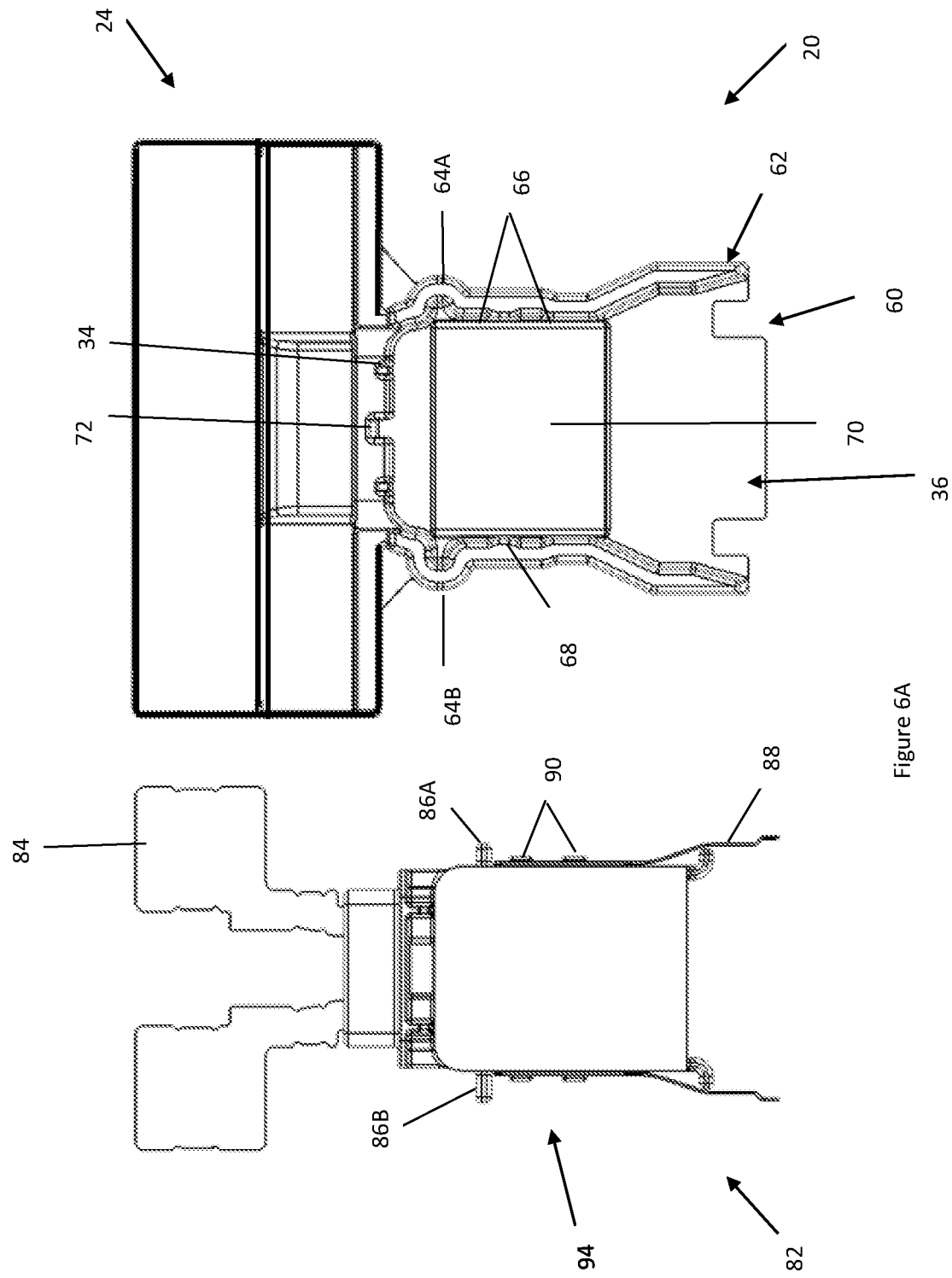
FIG. 6A is a plan view of a bottom of an integrated frame and connector located next to each other.

FIG. 6A illustrates a connector 82 and an integrated frame 20 located side by side. All of the engagement devices 94 of the connector 82 are visible (e.g., projection 86, flared header clip 88, retention projections 90, and platform 92 (not shown)). The connector 82 includes terminals 84 that extend into the photovoltaic laminate (not shown). The connector 82 also includes projections 86 on opposing sides. The projections 86 have a different size so that projection 86A is smaller than projection 86B so that the projection only fit within the ears 64A and 64B of the integrated frame in one configuration. Retention projections 90 are located adjacent to the projections 86 and the projections 90 assist in preventing longitudinal movement within the integrated frame 20 by the projections 90 fitting within the retention slots 66 and movement being restricted by retention walls 68. An end of the connector 82 that receives another connector includes flared header clips 88 that connect to the adjacent connector (not shown) when a connection is formed. The flared header clips 88 mirror the shape of the flared extensions 62. The integrated frame 20 also includes disengagement openings 60 that allow access to the flared header clips 88 to disconnect the connector 82 for an adjacent connector. The integrated frame 20 includes an alignment cavity 36 that receives the connector 82. A receiving pocket 70 is located within the alignment cavity 36 that receives a platform 92 which connects the flared header clips 88 to the connector 82. The receiving pocket 70 receives the platform 92 and assists in maintaining the platform 92 and connector 82 in communication. The integration portion 24 of the integrated frame 20 receives a bonding agent (not shown). The integrated frame 20 also includes alignment recesses 34 at the end of the alignment cavity 36. As shown a central recess 72 is located between the alignment recesses 34.

Figure 6B:
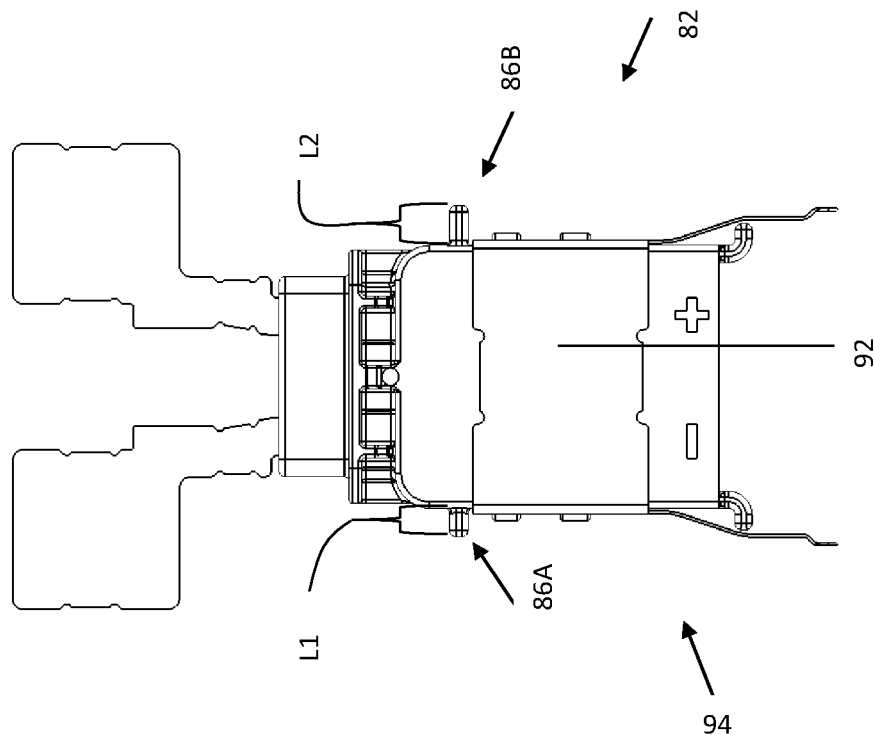
FIG. 6B is a top view of a connector with a header clip.

FIG. 6B depicts the opposing side of the connector 82 and engagement devices 94 shown in FIG. 6A. The connector 82 includes a platform 92 that extends into the receiving pocket 70 (shown in FIG. 6A). The length differences of the projection 86A and 86B is shown where 86A has a length L1 and 86B has a length L2 that is greater than the length L1.

Figure 6C:
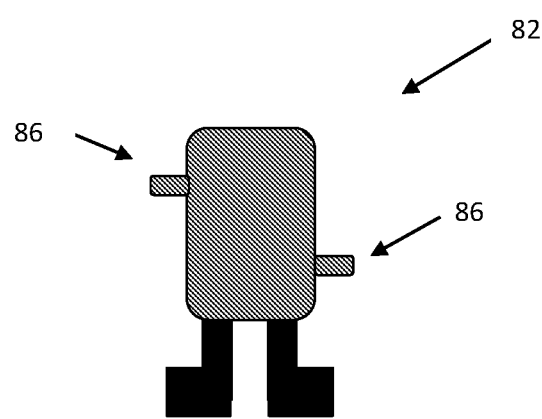
FIG. 6C is a top view of a connector.

FIG. 6C illustrates a top view of a connector 82 with projections located on opposing sides. The projections 86 are staggered and out of line so that the connector 82 can only be installed one way in an integrated frame (not shown).

Figure 7:
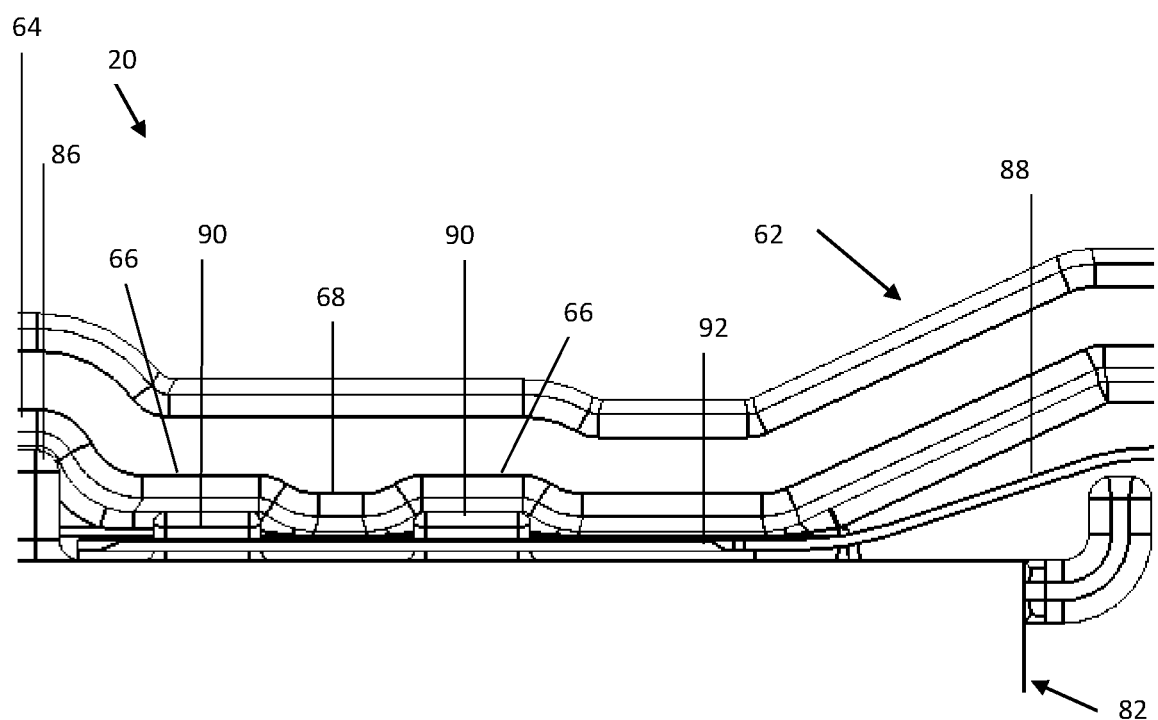
FIG. 7 is close-up view of a wall of an extension of the integrated frame of FIG. 5A.

FIG. 7 illustrates a close-up view of the mating relationship between the integrated frame 20 and the connector 82. The integrated frame 20 includes an ear 64 that receives a projection 86 of the connector so that the connector 82 can only be installed in one configuration as well as the projection 86 connecting to the integrated frame 20 so that the integrated frame 20 supports the connector 82. The connector 82 includes a pair of retention projections 90 that extend through the platform 92 and into retention slots 66 in the integrated frame 20 so that the platform 92 is sandwiched between the connector 82 and the integrated frame 20. A retention wall 68 is located between the retention slots 66 so that longitudinal movement of the connector 82 is prevented. The integrated frame 20 includes a flared extension 62 that mirrors the shape of the flared header clip 88 so that the flared header clip 88 extending from the platform 92 assists in retaining the connector 82 within the integrated frame 20.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of the elements, ingredients, components or steps. By use of the term "may" herein, it is intended that any described attributes that "may" be included are optional.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

It is understood that the above description is intended to be illustrative and not restrictive. Many embodiments as well as many applications besides the examples provided will be apparent to those of skill in the art upon reading the above description. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

- 2 Solar Module
- 4 Active portion
- 6 Base Plate
- 8 Support portion
- 10 Overlap portion
- 14 Locking feature
- 16 Connector channel
- 20 Integrated Frame (SIF)
- 22 Cover
- 24 Integration Portion (for adhering to the frame)
- 25 Connection region
- 26 Extension
- 27 Pocket
- 28 Step extension
- 30 Ledge (that creates a stop so that SIF is aligned)
- 31 Channels (on/in the ledge)
- 32 Connector recess
- 34 Alignment recess
- 36 Alignment cavity
- 38 Post
- 39 Bonding Agent
- 40 Molded in handles
- 42 Connection recess
- 50 Fastener Locations
- 58 Engagement Feature
- 60 Disengagement Opening
- 62 Flared Extension
- 64 Ears
- 66 Retention Slots
- 68 Retention Wall 70 Receiving Pocket
72 Central Recess
80 Pv laminate
82 connector
84 Terminal
86 Projection
88 Flared Header Clip
90 Retention Projections
92 Platform
94 Engagement Device

What is claimed is:

1. A photovoltaic module comprising:
a base plate; and
a photovoltaic laminate connected to the base plate, the photovoltaic laminate comprising:
   one or more electrical connectors at least partially extending from the photovoltaic laminate, each connector including one or more alignment features asymmetrically located on the connector, the one or more alignment features include a plurality of projections extending from each connector, and the plurality of projections extending on opposing sides of the connector; and
   one or more frames extending from the photovoltaic laminate and at least partially covering the one or more connectors, each frame including one or more engagement features corresponding to the one or more alignment features of the connectors to align the connectors relative to the frames and the photovoltaic laminate in a single configuration, the one or more engagement features include a plurality of extensions defining respective pockets in which the plurality of projections are respectively received, and the one or more frames each including a cover extending cantilever over each connector and further including an integration portion connected to the cover, the integration portion forming a connection with the photovoltaic laminate.

2. The photovoltaic module of claim 1, wherein the plurality of projections includes one projection extending further from the connector than another projection.

3. The photovoltaic module of claim 1, wherein the pockets are asymmetrically shaped to correspond with the asymmetric projections.

4. The photovoltaic module of claim 1, wherein:
each frame defines one or more receiving slots; and
each connector includes one or more retention projections extending therefrom, the one or more retention projections at least partially positioned within the one or more receiving slots of the frame to further limit movement of the connectors relative to the frames and the photovoltaic laminate.

5. The photovoltaic module of claim 4, wherein opposing sides of each connector include a plurality of retention projections.

6. The photovoltaic module of claim 1, wherein the one or more frames include
an integration portion forming a connection with the photovoltaic laminate.

7. The photovoltaic module of claim 6, wherein each connector is covered by a respective frame.

8. The photovoltaic module of claim 1, wherein the one or more connectors and the one or more frames form a cantilever connection with the photovoltaic laminate.

9. The photovoltaic module of claim 8, wherein each connector includes one or more terminals positioned at least partially within the photovoltaic element.

* * * * *